United States Patent [19]

Miller

[11] 4,357,549
[45] Nov. 2, 1982

[54] AUTOMATIC FREQUENCY ALTERATION CIRCUIT

[75] Inventor: Kelly A. Miller, Glen Burnie, Md.

[73] Assignee: U.S. Government as represented by the director of National Security Agency, Washington, D.C.

[21] Appl. No.: 212,061

[22] Filed: Dec. 2, 1980

[51] Int. Cl.³ .............................................. H03L 7/06
[52] U.S. Cl. ...................... 307/523; 328/15; 328/160; 328/167
[58] Field of Search ................... 328/15, 21, 167, 38, 328/160, 159, 158; 307/522, 523

[56] References Cited

U.S. PATENT DOCUMENTS

| | | | |
|---|---|---|---|
| 2,848,616 | 8/1958 | Tollefson | 328/15 |
| 3,421,141 | 1/1969 | Meyerhoff | 328/167 |
| 3,493,876 | 2/1970 | Zimmerman | 328/167 |
| 3,546,354 | 8/1968 | Uchlyama | 84/1.02 |
| 3,639,842 | 2/1972 | Zarcone et al. | 328/38 |
| 3,699,461 | 10/1972 | Huntsinger | 328/167 |
| 3,882,545 | 11/1972 | Titus | 360/137 |
| 4,024,414 | 5/1977 | Gurry | 307/523 |
| 4,123,773 | 3/1977 | Rotter et al. | 358/4 |
| 4,148,077 | 8/1977 | Bragas | 360/10 |

Primary Examiner—John S. Heyman
Attorney, Agent, or Firm—John R. Utermohle; Thomas O. Maser

[57] ABSTRACT

An apparatus for altering frequencies such that any one of a plurality of input frequencies automatically becomes another specified frequency. The value of the output frequency will remain constant regardless of which input frequency chosen, as long as the input frequencies have the relationship $a, 2a, 4a, 8a \ldots$ An input signal is received by a descending cascade of units composed of multipliers and filters. The multiplier portion of each unit must be in series with and receive the input stimuli before the filter portion of each unit. Each multiplier portion of the unit must also have a control input of a predetermined value. A phase lock loop inside of a feedback loop compensates for instantaneous variations of frequency in the input signal. This feedback loop is connected from the multiplier-filter unit to the control input for each multiplier portion.

7 Claims, 2 Drawing Figures

AUTOMATIC FREQUENCY ALTERATION CIRCUIT

BACKGROUND OF THE INVENTION

1. Field of the Invention

This invention relates generally to the field of electrical signal processing and more specifically to the field of automatic frequency alteration and control.

2. Description of the Prior Art

Devices for detection and correction of frequency variation are commonly known. Although such devices have almost unlimited utility, they are particularly useful in tape recorder applications which require a constant frequency relationship between original recording and playback.

In previously known systems, time base fluctuations in recorded signals have been alleviated by simultaneously recording a reference tone and the signal, using different channels of the tape recorder. When the precise frequency of the reference tone is known, the rate at which the tape in the recorder is moving is easily determined. On playback, the taped reference frequency becomes an input to the playback recorder to insure that the tape speed is proper to produce true frequency reproduction of the original recorded signal. A representative example of the above is U.S. Pat. No. 4,123,773 to Rotter et al. which utilizes a feedback loop to control minor fluctuations in tape drive speed.

While the above process appears to be easily executed, difficulties often arise in the physical implementation. Many recorders without the built-in servo capability necessary to compare reference tone frequency with tape speed require cumbersome follow-on processing equipment. Often, even tape recorders with servo/reference tone capabilities operate only at specific tone frequencies different from the frequency recorded on the tape which is being used. These recorders also require the full time-base compensation burden to be placed on reference tone circuitry in follow-on processing equipment. Conventionally implemented tracking reference circuitry typically uses a bank of band-pass filters, each centered on a different frequency. Filter selection is done via front panel control. The output of the selected filter is then fed into a phase locked loop (PLL) designed to lock on that particular frequency tone. Difficulty arises because the PLL must operate at a different center frequency if either the tape recorder playback speed or the tone frequency is changed. This requires either duplicating circuitry (multiple PLLs) or changing of PLL parameters. Both of these solutions are awkward, require operator assistance, and presume that the playback operator is aware of which reference tone frequency is recorded on any particular tape. This latter presumption is often incorrect, for it is common for a recording operator to use a reference tone which is some multiple or sub-multiple of the expected frequency. Devices disclosed in U.S. Pat. No. 3,546,354 to Uchiyama include apparatus which automatically synchronize input pitches between the tape and the original source. A major disadvantage of these apparatus is that they must be readjusted each time that the reference tone frequency is altered.

In an attempt to standardize reference tones for industrial applications, the Inter-Range Instrumentation Group (IRIG) has published suggested tape speed/reference tone relationships as follows:

| Tape Speed (ips) | Reference Tone (kHz) |
|---|---|
| 15.0 | 25.0 |
| 7.5 | 12.5 |
| 3.75 | 6.25 |
| 1.875 | 3.125 |

SUMMARY OF THE INVENTION

It is an object of the present invention to provide an automatic frequency alteration circuit which overcomes the many weaknesses of the prior art.

It is a further object of my invention to provide a totally automatic, flexible and simple frequency alteration circuit which will accept any one of a plurality of input frequencies.

Another object of my invention is to produce the same single controlled output signal regardless of which of a plurality of signals was provided to the input.

An automatic frequency alteration circuit having these and other advantages would include: an input to which is applied one of a plurality of input signals; means for providing a plurality of control signals; a plurality of first order units, each including mutiplier means for generating first order intermediate signals equal to the algebraic sum and difference of the input signal and a selected one of the control signals, and filter means for passing a selected one of the first order intermediate signals; and at least one second order unit including multiplier means for generating second order intermediate signals equal to the algebraic sum and difference of the selected first order intermediate signal and a selected one of the control signals and filter means for passing a selected one of the second order intermediate signals.

BRIEF DESCRIPTION OF THE DRAWINGS

Other objects and many of the attendant advantages of this invention will be readily appreciated as the invention becomes better understood by reference to the description below, when read in conjunction with the following drawings, wherein.

DESCRIPTION OF THE PREFERRED EMBODIMENT

Figure 1:
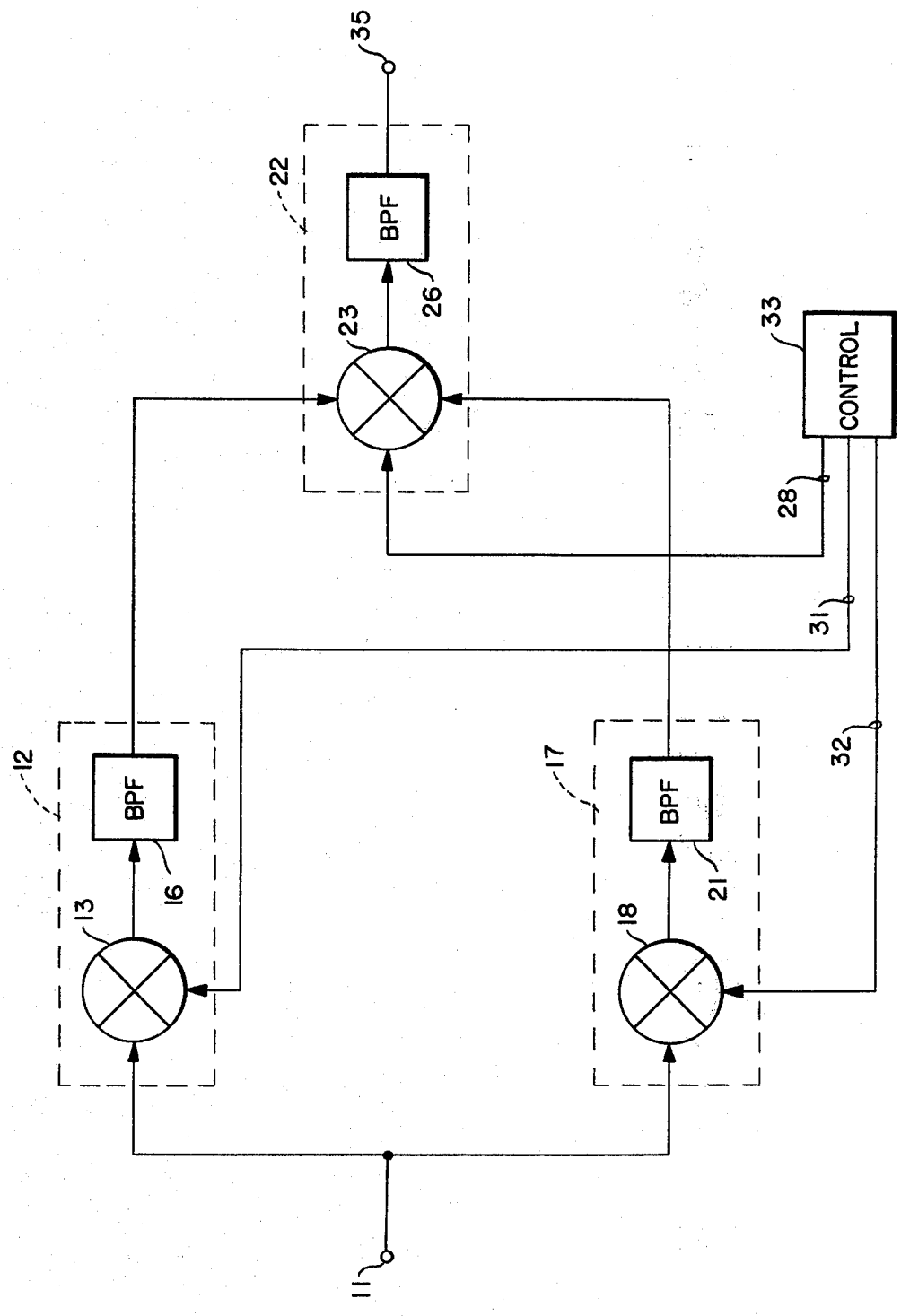
FIG. 1 illustrates a preferred embodiment of my invention suitable for use with four input signals.

FIG. 1 is a block diagram of a representative circuit embodying the concepts of my invention. Briefly, the circuit accepts an input which may have a value equal to any one of a plurality of predetermined frequencies, and provides a single, constant-frequency output regardless of which input frequency is present. No output appears, however, if any input other than one of the predetermined frequencies is present. (Small deviations are allowed for, based on the passband of selected filters, as more specifically set forth below).

In FIG. 1, a reference tone input 11 is connected to a unit 12 including a multiplier 13 followed by a band-pass filter 16. Input 11 is similarly connected to a second unit 17 also including a multiplier 18 followed by a band-pass filter 21. The output from each of the units 12 and 17 is connected to a third unit 22 also including a multiplier 23 followed by a band-pass filter 26. The multiplier portion of each unit within the circuit receives an additional input from a control 33; the input to unit 22 being applied through line 28 to multiplier 23, the input to unit 12 being applied through line 31 to multiplier 13, and the input to unit 17 being applied through line 32 to multiplier 18. An output 35 leaves the last unit in the circuit, in this example, the third unit 22.

For purposes of explanation, the possible reference tones which may be applied to input 11 are the previously indicated IRIG tones of 25.0 kHz, 12.5 kHz, 6.25 kHz, or 3.125 kHz. A conventional multiplier such as element 13 outputs two frequencies which are equal to the algebraic sum and difference of the frequencies applied to its inputs. If, for example, the frequency on input 11 is 25 kHz and the frequency on line 31 is 6.25 kHz, multiplier 13 will output signals having frequencies of 25 kHz±6.25 kHz, or 31.25 kHz and 18.75 kHz. If the frequency on input 11 is 12.5 kHz and the frequency on line 31 remains at 6.25 kHz, multiplier 13 will output signals having frequencies of 12.5 kHz±6.25 kHz, or 18.75 kHz and 6.25 kHz. Notice that the 18.75 kHz signal is present at the output of multiplier 13 both when the frequency on input 11 is 25 kHz and when it is 12.5 kHz. By adjusting band-pass filter 16 to a center frequency of 18.75 kHz, that signal will be applied to multiplier 23 when the signal on input 11 is either 25 kHz and 12.5 kHz, and in no other situation.

Similarly, if the signal on line 32 is set at a frequency of 1.56 kHz and band-pass filter 21 is adjusted to a center frequency of 4.69 kHz, the output of unit 17 will be 4.69 kHz only when the signal on input 11 is either 6.25 kHz or 3.125 kHz. No other signal on input 11 will provide a non-zero output on unit 17.

From the above discussion it is apparent that, when any one of the four IRIG tones is present at input 11, the only possible inputs to multiplier 23 from the band-pass filters are 18.75 kHz from filter 16 or 4.69 kHz from filter 21. It is further apparent that only one of these inputs is possible at any given time. If the signal on line 28 is set at a frequency of 7.03 kHz, the possible outputs from multiplier 23 are 18.75 kHz±7.03 kHz and 4.69 kHz±7.03 kHz. Both of these possibilities produce the frequency 11.72 kHz, which will be passed to output 35 if band-pass filter 26 is adjusted to an 11.72 kHz center frequency. It is thus seen that a signal having a frequency of 11.72 kHz appears at output 35 when, and only when, a signal equal to 25.0 kHz, 12.5 kHz, 6.25 kHz or 3.125 kHz is applied at input 11.

It is to be understood that the specific frequency values indicated above are for purposes of illustration only, and that an unlimited number of frequency combinations are possible. It is necessary only that, given an arbitrary lowest frequency, each higher frequency is greater by a power of two.

A first order unit is defined, for purposes of explaining my invention, as one directly accepting input signals from terminal 11 and the control 33 and providing at its output a selected first order intermediate signal equal either to the algebraic sum or difference of the input signal and a selected one of the control signals. A second order unit is defined as one accepting a first order intermediate signal from a first order unit and control 33 and providing at its output a selected second order intermediate signal equal to either the algebraic sum or difference of the first order signal and a selected one of the control signals. In general, an nth order unit would be one accepting an n-1st order intermediate signal from an n-1st order unit and control 33 and providing at its output a selected nth order intermediate signal equal to either the algebraic sum or difference of the n-1st order signal and a selected one of the control signals. The signal from control 33 to each multiplier may then be defined as having a frequency equal to one-half the difference between the two possible tones applied to that multiplier from either the input 11 or from the unit of the preceeding order. In the above example, the frequency on line 32 is 1.56 kHz, or ½(6.25−3.125). The frequency on line 31 is 6.25 kHz, or ½(25.0−12.5). The frequency on line 28 is 7.03 kHz, or ½(18.75−4.69).

A frequency meter or detector placed on output 35 can be used to monitor the accuracy of the reference tone provided to input 11, regardless of which of the four possible tones is present. Minor variations in the reference tone will be passed by the filters, but with additional circuitry can nevertheless be detected at output 35 by a departure from 11.72 kHz.

Figure 2:
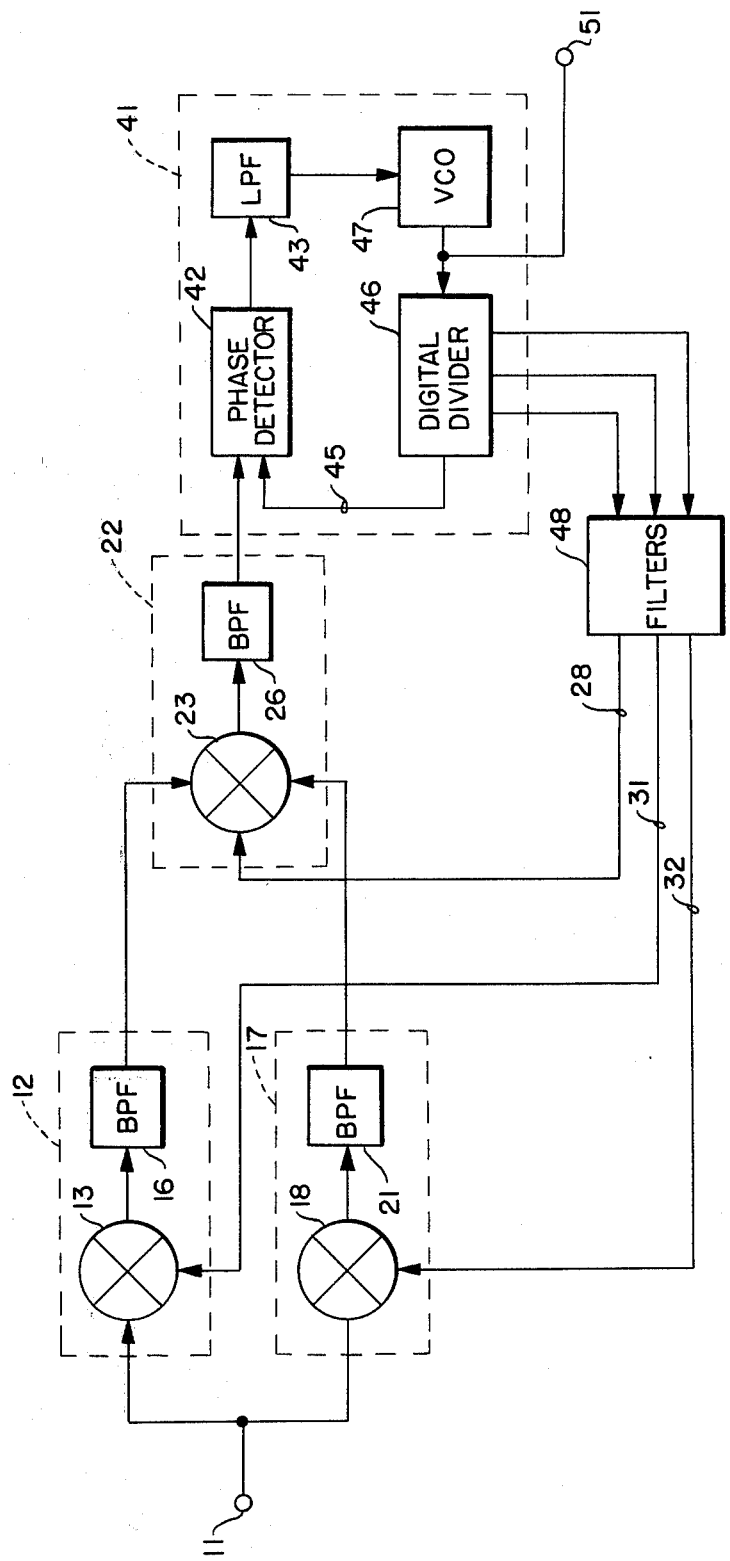
FIG. 2 illustrates a preferred embodiment of my invention suitable for use in a time base correction circuit.

FIG. 2 shows how the circuit of FIG. 1 may be used to provide automatic frequency control. The elements 11-32 of FIG. 2 may be identical to those elements having the same numbers in FIG. 1 and operate in an identical manner. A phase locked loop 41 includes a phase detector 42, a low-pass filter 43, a voltage controlled oscillator (VCO) 47 and a digital divider 46. Phase detector 42 receives input signals from bandpass filter 26 and divider 46, and outputs a signal indicative of the phase difference between the input signals. This difference, or error, signal is low-pass filtered by filter 43 and provided to VCO 47. Oscillator 47 provides an output signal, the frequency of which varies with changes in the input error signal from filter 43, causing digital divider 46 to step at a controllable rate and thus vary the signal provided to phase detector 42. Selected outputs from divider 46 are passed through a plurality of filters 48 to the multipliers 13, 18 and 23.

The construction and operation of digitally controlled phase locked loops is well documented in the prior art and need not be set forth here. A phase locked loop typical of those suitable for use in this invention is described in U.S. Pat. No. 3,889,186 to Larson.

As previously explained with respect to FIG. 1, any of the tones 25 kHz, 12.5 kHz, 6.25 kHz or 3.175 kHz when applied to input 11, will produce an 11.72 kHz output from filter 26. In the balanced state, VCO 47 is adjusted to a frequency which produces an 11.72 kHz output on line 47 from divider 46. Phase detector 42 produces no output so long as this condition is maintained. However, if the signal at input 11 is reproduced, for example, from the tape of a previously recorded reference tone, the signal at input 11 may vary slightly either from fluctuations in the playback drive mechanism or from stretching of the tape. A minor variation in tone at input 11 will necessarily result in a variation in the 11.72 kHz output from filter 26, which will be detected by element 42. More specifically, if the input frequency into input 11 varies from 6.25 kHz to 6.35 kHz, for example, the instantaneous output of band-pass filter 26 will be 11.82 kHz. This 11.82 kHz signal enters phase detector 42 where it is compared to the 11.72 kHz signal on line 47. Phase detector 42 sends pulses which indicate both that the output of band-pass filter 26 is greater than 11.72 kHz, and also the magnitude of the error. This signal passes through low-pass filter 43 which removes any voltage spikes caused by rapid changes in voltage, and then enters the voltage controlled oscillator (VCO) 47. The VCO operates as the master clock to regulate the entire circuit and any other equipment which is to be synchronized to the tape.

Peripheral equipment, if any, is connected at terminal 51. On receipt of an error signal from phase detector 42, the VCO outputs a pulse train which is faster or slower in proportion to the sign and magnitude of the error. Digital divider 46 outputs a plurality of pulse trains, each of which is a predetermined fixed fraction of the input provided from VCO 47. The fractions are those which provide the pulse trains necessary for a steady-state condition. In the above example, the fractions would be those necessary to produce pulse trains of 1.56 kHz on line 32, 6.25 kHz on line 31, and 7.03 kHz on line 28 when the output from VCO 47 is 11.72 kHz.

Any rate change in the output of VCO 47 thus results in an identical percentage change in the signals on lines 28, 31 and 32 as well as on line 45. In accordance with conventional principles of negative feedback, the output of VCO 47 will quickly stabilize at a new frequency which is an identical percentage change as the change to the input signal on input 11.

While FIG. 1 illustrates a specific embodiment of my invention capable of accepting four reference tones, it should be understood that a circuit utilizing any number of tones is a straightforward adaptation. In general, n reference tones will have the relationship $a \times 2^0$, $a \times 2^1$, ..., $a \times 2^{n-1}$, where a is the lowest acceptable frequency. If n is an even number the input terminal connects to n/2 first order units, the first order units connect to n/4 second order units, and so on in a descending cascade until only one unit remains. The output of this last unit becomes the output of the circuit. If n is an odd number the input converts to (n+1)/2 first order units, and all but the last unit connect in descending cascade order as in the case for n being even. The odd first order unit then connects to the final unit of the cascade arrangement to form the circuit output. Alternatively, the odd first order unit may be connected at any point in the cascade where there is an odd number of units in the order. As explained with the description of the circuit of FIG. 1, a control unit provides an input to the multiplier of each unit. The signal from the control to each multiplier will be a frequency equal to one-half the difference between the two possible tones applied to that multiplier from either the input or from the units of the preceeding order.

It is to be understood that this invention has many uses other than those specifically set forth in this specification and that I do not intend that it be limited to applications in time base correction circuits.

I claim:

1. An electrical circuit, comprising:
   an input to which is applied one of a plurality of input signals;
   means for providing a plurality of control signals;
   a plurality of first order units, each including
   (1) multiplier means connected to said input and one of said control signals for generating first order intermediate signals equal to the albegraic sum and difference of said input signal and a selected one of said control signals and
   (2) filter means for passing a selected one of said first order intermediate signals; and
   at least one second order unit including
   (1) multiplier means connected to said plurality of first order units for generating second order intermediate signals equal to the algebraic sum and difference of said selected first order intermediate signal and a selected one of said control signals and
   (2) filter means for passing a selected one of said second order intermediate signals.

2. The circuit of claim 1 wherein the input signals have the frequency relationship $a \times 2^0$, $a \times 2^1$, ..., $a \times 2^{n-1}$, where n is the total number of input signals and a is the lowest frequency input signal.

3. The circuit of claim 2, wherein the number of first order units is n/2 where n is an even number, and (n−1)/2+1 when n is an odd number.

4. The circuit of claim 1 wherein said filter means are band-pass filters.

5. The circuit of claim 1 further comprising an output and wherein said at least one second order unit further includes a plurality of second and higher order units connected in descending cascade order with the filter means from the highest order unit passing a selected one of said highest order intermediate signals to said output.

6. The circuit of claim 5 wherein said control signal providing means further comprises feedback means connected to said output to compensate for variations in the frequency of the input signal.

7. The circuit of claim 6 wherein said feedback means comprises a phase locked loop including a phase detector, a voltage controlled oscillator and a digital divider circuit connected in series.

* * * * *